United States Patent [19]
Cordaro

[11] 3,983,543
[45] Sept. 28, 1976

[54] RANDOM ACCESS MEMORY READ/WRITE BUFFER CIRCUITS INCORPORATING COMPLEMENTARY FIELD EFFECT TRANSISTORS

[75] Inventor: William Cordaro, Wappingers Falls, N.Y.

[73] Assignee: International Business Machines Corporation, Armonk, N.Y.

[22] Filed: June 30, 1975

[21] Appl. No.: 591,989

[52] U.S. Cl. .......................... 340/173 FF; 307/238
[51] Int. Cl.² .................. G11C 11/40; H03K 3/281
[58] Field of Search.. 340/173 NR, 173 R, 173 AM, 340/173 FF, 173 RC, 173 SP; 307/238, 279

Primary Examiner—Thomas A. Robinson
Attorney, Agent, or Firm—Wesley DeBruin

[57] ABSTRACT

Disclosed is a Read/Write Buffer circuit for a random access memory integrated circuit chip based upon complementary enhancement mode field effect transistor technology.

11 Claims, 9 Drawing Figures

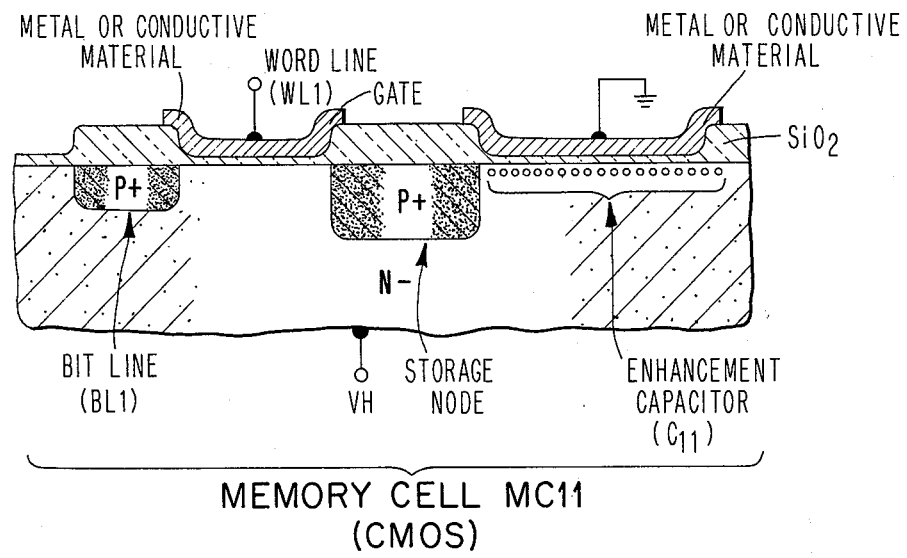
FIG. 4
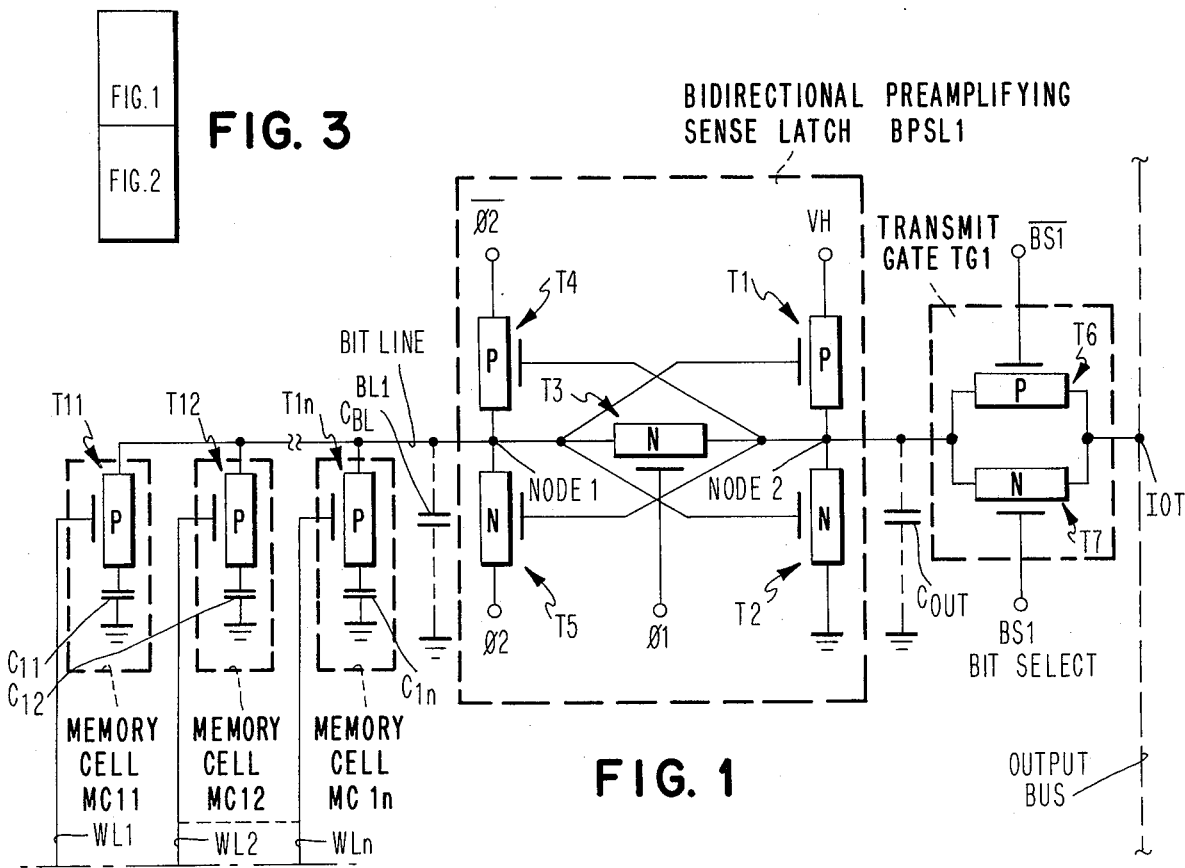
FIG. 3
FIG. 1

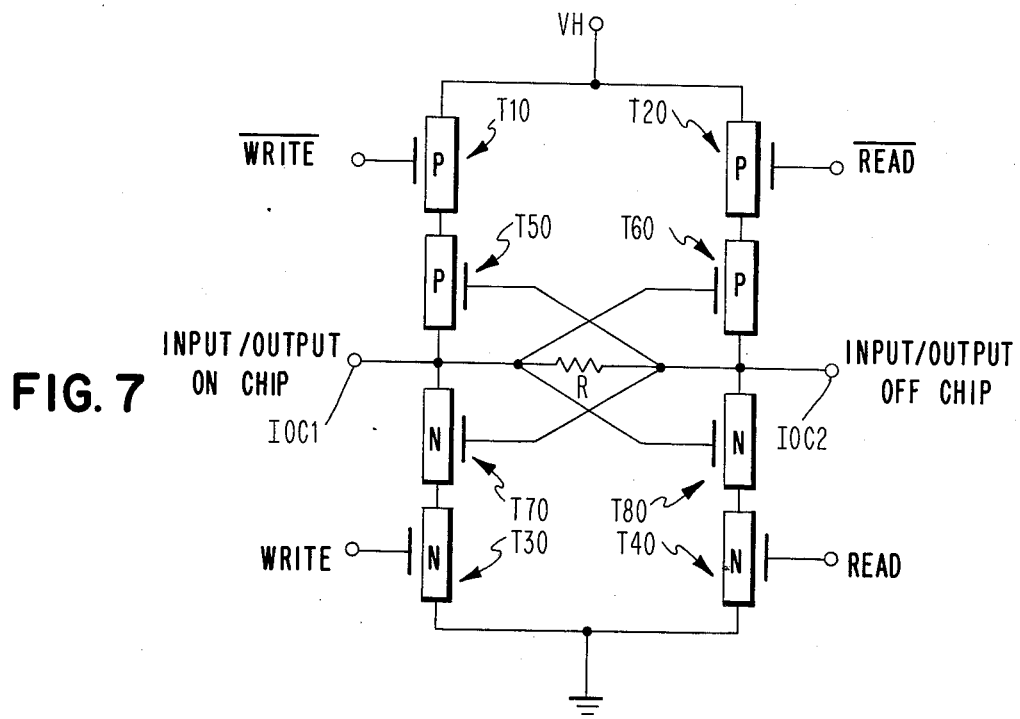
FIG. 7
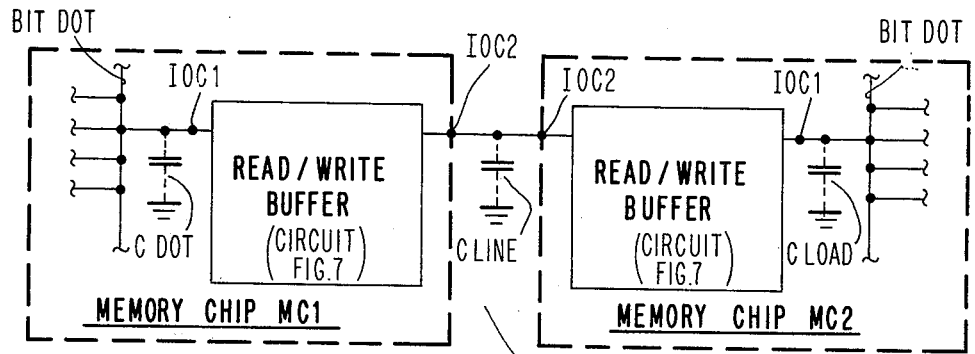
FIG. 8
FIG. 9

RANDOM ACCESS MEMORY READ/WRITE BUFFER CIRCUITS INCORPORATING COMPLEMENTARY FIELD EFFECT TRANSISTORS

CROSS REFERENCE TO RELATED APPLICATIONS

Reference is made to U.S. Pat. application, Ser. No. 565,326 entitled "Multiplication Mode Bistable Field Effect Transistor and Memory Utilizing Same," filed Apr. 7, 1975 by H. W. Curtis and R. L. Verkuil and said application of common assignee with the instant application.

Reference is made to U.S. Pat. application Ser. No. 591,988 entitled "Improved Random Access Memory Employing Single Ended Sense Latch for One Device Cell" filed June 30, 1975 by William Cordaro, and of common assignee herewith.

BACKGROUND OF THE INVENTION AND PRIOR ART

Field Effect Transistor technology is a relatively highly developed art, which is currently under extensive development and investigation by the art in general. There are a sizeable number of published articles, patents and text books directed to theory, structure, methods of fabrication, process technology, circuitry and application of field effect devices.

MOSFETs (Metal-Oxide Silicon Field Effect Transistors), MISFETs (Metal Insulator Silicon Field Effect Transistors) and IGFETs (Insulated Gate Field Effect Transistors) are terms extensively employed in the art and possessing well established definitions in the art. "N-channel", "P-channel", "Enhancement Mode", "Depletion Mode" and "CMOS" (Complementary Metal Oxide Silicon) are additional terms extensively employed in the art and possessing well established definitions. At least certain of the foregoing terms will be used hereinafter. When used hereinafter, their use will be in full accord with the generally established definition given said phrase or word in the art.

Numerous texts fully explain the theory of operation of field effect transistors. Two such texts are: (1) "MOSFET in Circuit Design" by Robert H. Crawford (Texas Instrument Series) McGraw Hill, copyright 1967 by Texas Instruments Incorporated and (2) "ELECTRONICS: BJTs, FETs and Microcircuits" by E. James Angelo, Jr., McGraw Hill Electrical and Electronic Engineering Series, copyrighted 1969 by McGraw Hill.

A publication tracing the development of the field effect transistor, evidencing its high state of development, and explaining in non-mathematical terms its operation is the following article: "Metal-Oxide Semiconductor Technology" by William C. Hittinger, Scientific Americana, August 1973, pages 48 through 57.

U.S. Pat. No. 3,641,511 granted Feb. 8, 1972 to James R. Cricchi et al is directed to a "Complementary MOSFET Integrated Circuit Memory". A random access nondestructive voltage readout complementary MOSFET memory fabricated on a single integrated circuit "chip" including not only a plurality of identical memory cells arranged in a maxtrix array, but also the digital address decoding logic circuitry as well as the input/out buffer circuitry including data line driver circuits insulating the memory cell array from external data lines and input/output control logic circuits insulating the address decoding logic circuitry and the data line driver circuits from external read/write control and strobe input sources. Both N-channel and P-channel MOSFETs are fabricated adjacent to one another as complementary pairs on the same "chip" with the exclusion of at least one guard ring diffusion region between adjacent drain diffusion regions of the complementary pairs by the inclusion of a relatively thick oxide layer (15-20KA) which operates to minimize internal interconnection line capacitance and parasitic surface channels. The data line drivers are bidirectional to provide nondestructive readout, fast readout response, noise immunity and low-input capacitance. Each memory cell is comprised of two pairs of complementary MOSFETs coupled together as cross-coupled inverter circuits. Additionally, each cell is provided with a pair of parallel connected complementary MOSFETs acting as an input/output transmission switch and are coupled to a common input/output internal data line and operated by separate address command signals from the address decoding logic circuit. Another pair of parallel connected complementary MOSFETs are coupled to the memory cell as a feedback transmission switch and are operated by still other separate address command signals from the address decoding logic circuit. The address command logic utilized to operate the parallel connected pairs comprising the input/output transmission switch and the feedback transmission switch is timed to permit nondestructive readout of the memory cell.

U.S. Pat. No. 3,718,915 granted Feb. 27, 1973 to William R. Lattin is directed to "Opposite Conductivity Gating Circuit for Refreshing Information in Semiconductor Memory Cells". Circuit for refreshing information provided as different potentials in semiconductor cells of a dynamic metal oxide semiconductor (MOS) random access memory array with greater speed and less critical clock pulse timing. The circuit is also used for reading information from cells. The circuit may be used in a memory with a plurality of cells provided on semiconductor chip, as for example, 1,024 cells arranged in 32 rows and 32 columns, each providing one information bit. The memory may be of the dual rail type or the single rail type and is illustrated as a dual rail memory with a DATA bus which applies potentials to the cells in each column and a READ bus for indicating the information in the cells. The cells may include silicon gate field effect transistors (FET) which are all of the same conductivity type, with the circuit for refreshing the information being formed by devices of complimentary types. A first pair of complimentary MOSFET's form a pair of gates selectively rendered operative by the READ bus for applying one of the two potentials which form the information bits in the cells to an interim storage point. A transmission gate applies the stored potential to the DATA bus to refresh the information potential in the cell. A single circuit restores the potentials of all the cells in a column at high speed, with low voltage operation and non-critical timing of clock pulses.

Reference is made to U.S. Pat. No. 3,740,732 granted June 19, 1973 to Pierre M. Frandon and directed to a "Dynamic Data Storage Cell". The dynamic data storage cell disclosed in U.S. Pat. No. 3,740,732 requires only one insulated field effect transistor to store binary data. The drain of the FET is connected to a data input line and data is stored at the source node of the transistor by inherent capacitance between the source diffusion and the substrate. The capacitance of the source electrode is enhanced by forming a heavily doped layer to underlie a portion of the source diffusion. Using the substrate as circuit ground enables the fabrication of an array of transistors for a random access memory wherein the surface area of the semiconductor chip is minimized.

U.S. Pat. No. 3,757,310 granted Sept. 4, 1973 to Brian F. Croxon is directed to a "Memory Address Selection Apparatus Including Isolation Circuits". A semiconductor memory chip includes buffer circuits positioned between the input address lines applied to the chip and the decoder circuits coupled to the cells of the memory array. Each of the buffer circuits is arranged to translate low level logic address signals applied to its input terminal into a pair of high level complementary signals suitable for driving a pair of address selection lines applied to the input terminals of the decoder circuits. During a first interval of a memory cycle prior to address selection time each buffer circuit is forced to a predetermined state. This forces each pair of address selection lines to a first state selected to enable each of the decoder circuits to be precharged to a first predetermined state during the first interval. Subsequently, during address selection time, a clocking signal conditions each of the buffer circuits to switch only one address selection line of each pair of lines from a first state to a second state in accordance with the state of the low level address information signal applied to its input terminal. This causes each of the decoder circuits which has one of its input terminals forced to a second state to discharge rapidly from the first predetermined state with only the addressed decoder circuits remaining at the first predetermined state.

U.S. Pat. No. 3,796,893 granted Mar. 12, 1974 to Charles R. Hoffman et al is directed to "Peripheral Circuitry for Dynamic MOS RAMS". Improved circuits for a dynamic MOS RAM having a storage array of inverting storage cells, including an improved buffer, an improved write circuit and a sense circuit. The input buffer circuit includes a dynamic latch circuit clocked by the first clock complement signal and is compatible with TTL logic levels. The cross-coupled gate nodes of the dynamic latch are conditionally discharged by circuitry which includes a ratio type first address inverter, and a second ratio type address inverter followed by a third ratioless inverter, whose output conditionally discharges one of the cross-coupled gate nodes of the dynamic latch. A separate write circuit drives each digit-sense column bus line, and includes a push-pull driver clocked by the third clock input signal. The pull-up and pull-down field effect transistors of the push-pull driver each have an exclusive OR type circuit for conditionally discharging the precharged gate electrodes of the pull-up and pull-down field effect transistors, depending on the voltages on the data input signal and the data control signal. The ratioless data control inverter and the data input inverter provide the complement signals required by the two exclusive OR type circuits.

SUMMARY OF THE INVENTION

A Read/Write buffer circuit, or send/receive circuit is described employing complementary field effect technology. The Read/Write buffer circuit may be considered a bidirectional current sense circuit utilizing transadmittance amplifiers readily fabricated in CMOS technology. The low impedance and low switching voltage of the Read/Write buffer circuit results in the circuit being capable of receiving binary data and sending binary data at increased speed. The Read/Write circuit is bidirectional.

The bidirectional Read/Write buffer circuit has particular utility in communicating between monolithic circuit chips. In particular, between first and second memory chips and between a memory chip and a logic chip. In these applications, the buffer circuit provides at least the following advantages (1) conserves I/O requirements (2) provides fast response when communicating off chip (3) reduces current changes due to driving off chip, and (4) minimizes noise coupling.

The Read/Write buffer circuit has particularly utility when employed in pairs to communicate between monolithic memory chips. Namely, where at least one Read/Write buffer circuit on each chip is employed as one member of a pair of driver receiver circuits. From the detailed description of the preferred embodiment hereinafter it will be fully apparent to persons skilled in the art that the utility and advantages of the Read/Write buffer circuit is not limited to communication between memory chips or memory and logic chips. It will be apparent to persons skilled in the art that the latch capability of the Read/Write buffer circuit has particular utility and advantages in certain memory to logic communication applications.

The Read/Write buffer circuit in accordance with the invention has particular utility and advantages when employed in conjunction with the memory circuitry disclosed and claimed in the afore-identified U.S., Pat. Application Ser. No. 591,988.

U.S. Pat. Application Ser. No. 591,988, filed by applicant, on even date with the instant application, is of common assignee with the instant application. The specification and drawing of U.S. Pat. Application Ser. No. 591,988 is fully incorporated by reference herein to the same extent as though it was fully set forth herein.

It is a primary object of the invention to provide an improved Read/Write buffer circuit for a Random Access Monolithic memory.

It is an object of the invention to provide an improved Random Access Monolithic memory having at least one Read/Write buffer circuit and wherein each memory cell consists essentially of a single FET device having an enhancement capacitor capability.

It is an object of the invention to provide a send/receive circuit having particular utility and advantage when employed in pairs to provide bidirectional communication between monolithic circuit chips.

It is an object of the invention to provide an improved memory chip employing CMOS technology and which may be operated from a single low voltage supply.

It is an object of the invention to provide an improved bidirectional amplifying sense latch circuit employing CMOS technology wherein low impedance and low switching voltages enable the latch circuit to operate at increased speeds.

It is an object of the invention to provide a send/receive circuit for CMOS technology utilizing a transadmittance amplifier configuration.

It is an object of the invention to provide an improved bidirectional preamplifying sense latch particularly adapted to facilitate rapid and efficient electrical communication of binary data between monolithic circuit chips.

The foregoing and other objects, features and advantages of the invention will be more apparent from the following more particular description of the preferred embodiments of the invention as illustrated in the accompanying drawings.

BRIEF DESCRIPTION OF THE DRAWINGS

FIG. 1 depicts the circuitry of a first row of an n column, m row monolithic memory in accordance with the invention disclosed and claimed in U.S. Pat. application Ser. No. 591,988.

FIGS. 1 and 2, placed together as shown in FIG. 3, depict the circuitry of n column m row monolithic memory in accordance with the invention disclosed and claimed in U.S. Pat. application Ser. No. 591,988.

FIG. 4 depicts in cross sectional view a single memory cell of the $n \times m$ memory cells of the monolithic memory in accordance with the invention disclosed and claimed in U.S. Pat. application Ser. No. 591,988.

FIG. 7 depicts the circuitry of the Read/Write buffer circuit in accordance with a preferred embodiment of the invention.

FIG. 8 depicts a schematic view of a first memory chip having a Read/Write buffer circuit (FIG. 7) connected to a second memory chip (alternatively a logic chip) having a Read/Write buffer circuit (FIG. 7) all in accordance with a preferred embodiment of the invention.

FIG. 9 depicts the active circuit portions of first and second Read/Write buffer circuits connected as shown in FIG. 8, and where binary data is being communicated from the first memory chip to the second memory chip (or logic chip).

Description of the Preferred Embodiment

Figure 2:
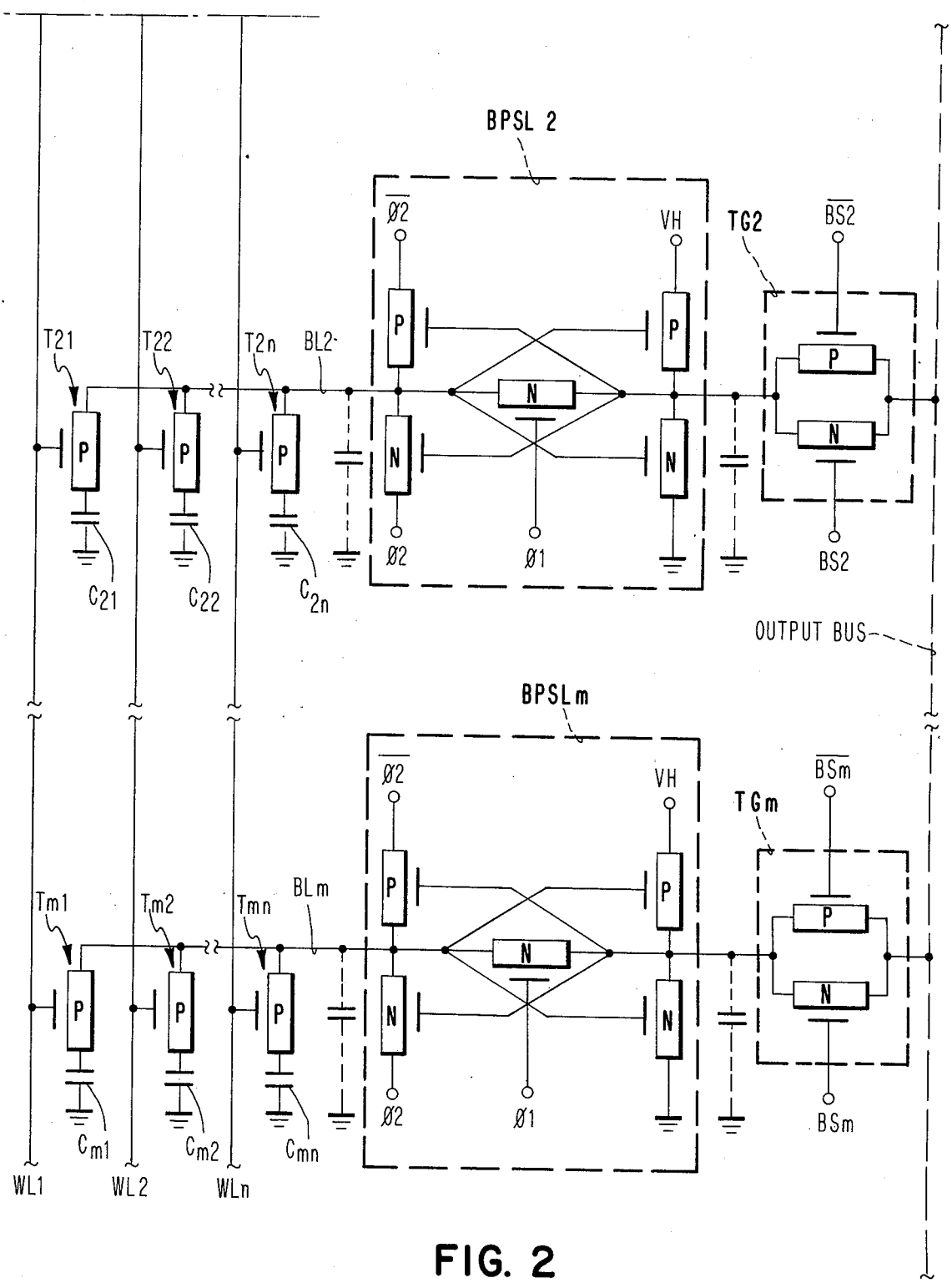
FIG. 2 depicts the circuitry of the second and mth row of the n column, m row monolithic memory in accordance with the invention disclosed and claimed in U.S. Pat. application Ser. No. 591,988.

The preferred embodiment of the invention is the Read/Write buffer circuitry as depicted in FIGS. 7, 8 and 9 and employed in combination with the invention disclosed and claimed in United States Patent Application Serial No. 591,988.

Initially the invention disclosed and claimed in United States Patent Application Serial No. 591,988 and its operation will be described with reference to the drawing. Referring to FIG. 1, the circuitry of a first row of a monolithic memory having m rows is depicted. Each row of the memory includes n memory cells. Each memory cell is comprised of a P-channel enhancement mode field effect transistor and an enhancement capacitor integrally formed therewith as depicted in FIG. 4. The memory cell as depicted in FIG. 4 is more fully described hereinafter. The circuitry enclosed broken line labelled "Memory Cell, MC11" in FIG. 1 is representative of each of the memory cells. It will be noted that the memory cell MC11 includes the P-channel enhancement mode field effect transistor T11 and enhancement capacitor C11. In FIG. 1, three of the n memory cells are shown, namely, MC11, MC12 and MC1n. Word lines WL1, WL2 - - - - WLn are respectively connected to the gate electrode of the P-channel FET of memory cells MC11, MC12 through MC1n. One terminal of each of the P-channel FET's T11 through T1n is connected to the bit line BL1. The second terminal of each of the P-channel FET's T11 through T1n is shown connected via its enhancement capacitor to ground potential. The bit line BL1 is connected to node 1 of Bidirectional Preamplifying Sense Latch BPSL1. Node 2 of the Bidirectional Preamplifying Sense Latch is connected to a first terminal of transmit Gate TG1.

A capacitor $C_{BL}$ is shown in dashed lines connected between Node 1 and ground. The dashed lines indicates that no particular structure is added to the monolithic memory chip to provide the capacitor $C_{BL}$. The capacitor $C_{BL}$ represents the distributed stray capacitance of the bit line BL1 and memory cells connected thereto. Correspondingly the capacitor $C_{out}$ is shown in dashed lines connected between Node 2 and ground. The dashed lines again indicate that no particular structure is added to the monolithic memory chip to provide the capacitor $C_{out}$. The capacitor $C_{out}$ represents the distributed stray capacitance at the interconnection of Node 2 and the transmit gate TG1. The magnitude of the capacitor $C_{BL}$ is very much greater than the magnitude of $C_{out}$. The magnitude of $C_{BL}$ is also very much greater than the enhancement capacitor ($C_{11}$ for example) of any one of the memory cells.

Still referring to FIGS. 1 and 2, each Bidirectional Preamplifying Sense Latch, such as BPSL1, essentially comprises five interconnected enhancement mode field effect transistors, namely, T1, T2, T3, T4 and T5. T1 and T4 are respectively P-channel enhancement mode field effect transistors. T2, T3 and T5 are respectively N-channel enhancement mode field effect transistors. T4 is connected between Node 1 and a controlled variable potential source $\bar{\phi}2$. T5 is connected between Node 1 and a controlled variable potential source $\phi2$. T1 is connected between Node 2 and a potential source VH. T2 is connected between Node 2 and ground potential. T3 is connected between Node 1 and Node 2. The gate of T3 is connected to a controlled variable potential source $\phi1$. The gate of T1 is connected to Node 1. The gate of T2 is connected to Node 1. The gate of T4 is connected to Node 2. The gate of T5 is connected to Node 2.

Each transmit gate, TG1, TG2 through TGM comprises two interconnected enhancement mode field effect transistors, namely, T6 and T7. T6 is a P-channel enhancement mode field effect transistor. T7 is an N-channel enhancement mode field effect transistor.

From FIGS. 1 and 2 it will be seen that Node 2 of each of the sense latches BPSL1, BPSL2 through BPSLM may be connected via its transmit gate to an Output Bus. The Output Bus is designated by the labelled broken line in FIGS. 1 and 2. Thus each sense latch may be orthogonally dotted (ORred) to the Output Bus.

Referring to FIG. 4, depicted in cross section is a single representative memory cell of the $n \times m$ memory cell array in accordance with the invention disclosed and claimed in U.S. Pat. application Ser. No. 591,988. Solely for convenience of explanation consider the memory cell depicted in FIG. 4 to be memory cell MC11 of FIG. 1. Further, it will be immediately apparent that the structure depicted in FIG. 4 is very similar to a conventional P-channel enhancement mode field effect transistor. One terminal of the storage cell MC11 labelled "Bit Line (BL1)" is a P+ semiconductor type region contained within the N— semiconductor substrate. It will be appreciated, particularly be persons skilled in the art, that the P+ type region in FIG. 4 labelled bit line is commonly referred to in the art as a "diffused bit line." In the preferred embodiment, bit line BL1 is an elongated P+ type region common to field effect transistors T11 through T1N (Memory cells MC11 through MC1N) as shown in FIG. 1. The second P+ type region in the N— type substrate, as depicted in FIG. 4, bears the reference legend "Storage Node". It will be appreciated, particularly by persons skilled in the art that there is a discrete "storage node" for each memory cell. Further associated with each storage node is a discrete enhancement capacitor. Referring to FIG. 4, the region of the planar surface of the N— substrate extending between the first and second P+ regions namely, between the Bit Line and Storage Node is conventionally termed a channel when capacitively coupled to a metal electrode or gate electrode. It will further be noted in FIG. 4, that the gate electrode is also labelled "Word Line (WL1)" in accordance with its function in the preferred embodiment. Further it is to be noted that the N— substrate has a potential of VH impressed thereon.

Still referring to FIG. 4, it will be seen that an enhancement capacitor is depicted to the right of the storage node. The metal or conductive material shown connected to ground may be considered to be the lower plate of capacitor $C_{11}$ of memory cell MC11 (FIG. 1). The upper plate of capacitor $C_{11}$ may be considered to be the storage node as depicted in FIG. 4. The enhancement capacitor is a non-linear capacitor formed by predetermined electrical conditions between the storage node and the metal conductive material connected to ground.

A brief and succinct description of the theory and operation of the enhancement capacitor and the conditions under which it is formed can be found in the following references: (1) Cobbold, Richard S.C.: "Theory and Applications of Field-Effect Transistors", Pages 230–233, Wiley-Interscience 1970; (2) Richman, Paul: "MOS Field Effect Transistors and Integrated Circuits", Pages 47–53, Wiley-Interscience 1973.

To summarize each of the $n \times m$ memory cells of the random access memory in accordance with the invention disclosed and claimed in U.S. Pat. application Ser. No. 591,988, essentially comprises a P-channel field effect structure of the type depicted in FIG. 4. N memory cells are associated with each bit line. Each memory cell includes a discrete storage node and structure inherently adapted to form a non-linear capacitor.

The conditions required for writing and reading binary data (ones or zeros) into or from the storage cell of the type depicted in FIG. 4 are succinctly stated as follows:

WRITING:

A BINARY ZERO

1. VH, where VH has a positive magnitude in the order of 4.5 volts, is impressed on the bit line.
2. Word line (gate) goes to ground potential.
3. Enhancement capacitor is formed and charges to approximately +4.5 volts.

A BINARY ONE

1. Zero, or ground potential is impressed on the bit line.
2. Word line (gate) goes to ground potential.
3. Enhancement capacitor not formed - no charge on enhancement capacitor.

READING:

A BINARY ZERO

1. VH/2, or in the order of +2 volts, impressed on the bit line, via devices T1, T2 and T3.
2. Word line (gate) goes to ground potential.
3. Enhancement capacitor discharges from +4.5 volts, bit line voltage rises.

A BINARY ONE

1. VH/2, or in the order of +2 volts, impressed on the bit line, via devices T1, T2 and T3.
2. Word line (gate) goes to ground
3. Enhancement capacitor not formed (no appreciable charge thereon) bit line voltage does not rise.

It will be appreciated by persons skilled in the art that the specific magnitudes of potentials, capacitors and the like throughout this patent application specification are expressly set forth for convenience of explanation and to facilitate a clear, concise and accurate understanding of the principles upon which applicant's invention and its operation are predicated. The specific values and magnitudes set-forth are not to be construed as limiting the scope, practice or teaching of applicant's invention.

Referring to FIG. 1, the capacitance $C_{BL}$ has a magnitude in the order of 3.5 pico farads. The capacitance $C_{BL}$ is related in magnitude to the capacitance $C_{out}$ as follows:

$$C_{BL} \approx 3.5 \text{pf} >> C_{out}$$

The capacitance, as stated earlier, of the enhancement capacitor of each memory cell is non-linear, i.e., its capacitance value varies with potential. As depicted in FIGS. 1 and 2, each memory cell has an inherent enhancement capacitor integrally formed in the P-channel memory cell. For the $n \times m$ memory cells of the memory these enhancement capacitors are respectively designated in FIGS. 1 and 2 as $C_{11}, C_{12}, ---- C_{1n}$; $C_{21}, C_{22} ---- C_{2n}; ----; C_{m1}, C_{m2} --- C_{mn}$. Subject to fabrication tolerances and process variations each memory cell is identical in structure and operation. Also, each enhancement capacitor of each memory cell is identical in structure and operation. Thus, the following description and explanation will make reference solely to memory cell MC11 and enhancement capacitor $C_{11}$. When capacitor $C_{11}$ is charged to approximately +4.5 volts, its capacitance is in the order of 0.39pf, whereas when capacitor $C_{11}$ is charged to approximately +1.45 volts its capacitance is in the order of 0.03pf.

The foregoing relationships may be expanded and summarized for a Random Access Memory Employing Single Ended Sense Latch for one device cells in accordance with the invention as claimed in U.S. Pat. application Ser. No. 591,988, as follows:

1. $C_{BL} \simeq 3.5\text{pf} \gg C_{11}$, $C_{out}$ at $V_{CBLref} \simeq 2$ volts, where $V_{CBLref}$ is defined as reference potential of bit line, and the 3.5pf capacitance represents a typical bit line capacitance value for 128 bits on the bit line at a voltage of 2 volts.

2. a. $C_{11} \simeq .39\text{pf}$ at $V_{C11} = 4.5$ volts, where $V_{C11}$ is defined as the voltage on storage node (4.5V = stored "0")
   b. $C_{11} \simeq .03\text{pf}$ at $V_{C11} = |V_{TP}| \simeq 1.45$ volts, where $|V_{TP}|$ is defined as threshold voltage of P-channel FET.

3. $\Delta V_{BL} \simeq C_{11}/C_{11} + C_{BL} (V_{C11} - V_{CBLref})$ where $\Delta V_{BL}$ is defined as signal present on the bit line when reading the charge stored on $C_{11}$. Typical signals are $\Delta V_{BL} \simeq .25$ volts when reading "0", and $\Delta V_{BL} \simeq .005$ volts when reading "1".

4. When the storage node of cell MC11 is at $|V_{TP}| \simeq 1.45$ volts the latch (BPSL1) assumes the following state: $V_{CBL}$ = ground, and $V_{Cout}$ = VH. The reasons for this are Item 2b and supra.

5. When the storage node of cell MC11 is at VH ≃ 4.5 volts, the latch (BPSL1) is forced to the following state: $V_{CBL}$ = VH, and $V_{Cout}$ = ground. The reasons for this are Item 2a and supra.

6. The useful signal in reading "1" ≃ 'design biases in achieving a preferred state', this includes both power supply and device tolerances and the effect of timing skews. NOTE: This signal has a weak dependency on the number of bits on a bit line.

7. The useful signal in reading "0" |(1-Av) ($\Delta V_{BL}$ - noise)| - useful signal in reading "1", where Av is defined as the voltage gain of the preamplifier formed by devices T1 and T2, typical value ≃ 30. NOTE: The gain of this preamplifier is primarily determined by the effective channel length devices T1 and T2. The longer the effective channel lengths, the higher the voltage gain. Since the signal on the bit line is a strong function of the number of bits on a bit line, see Items 1, 2 and 3, one can visualize that the number of bits on a bit line can be increased readily and still maintain a strong useful signal by controlling the gain of the preamplifier.

Referring to FIGS. 1 and 4, when the storage node of memory cell MC11 for example has $V_{TP} \approx 1.4$ volts stored on the enhancement capacitor, the enhancement capacitor portion of the storage capacitor is not formed, however, leakage current tends to reform the enhancement capacitor by having the storage node go towards VH. In the conventional use of a one device cell, this movement of the storage node would reduce the readable signal from a logical "1", however, with this present scheme the storage node can have its potential raised to $V_{CBLref}$ and still not have any effect on the useful signal, since the latch has a preferred state. This thereby allows a longer interval between refreshing the memory for the same level of leakage currents.

As stated earlier, the Bidirectional Preamplifying Sense Latches, for example, see BPSL1 FIG. 1, each have two stable states of conductivity, where one of said two states is a preferred state. The preferred state of the Bidirectional Preamplifying Sense Latch allows more signal for binary "0" to be unambiguously read. The Bidirectional Preamplifying Sense Latch provides its own reference voltage on the bit line, which allows the cell to be read, thus eliminating tracking errors that would occur if a separate reference supply were to be utilized. This self biasing reference voltage also biases devices T1 and T2 in their high gain region. The Bidirectional Preamplifying Sense Latch amplifies the bit line voltage before being set. The Bidirectional Preamplifying Sense Latch allows more bits to be placed on the bit line and facilitates fast access times at low voltages (5 volts) without additional controls. The above recited features and advantages will be more fully apparent from the description and explanation set-forth hereinafter and in U.S. Pat. application Ser. No. 591,988.

The foregoing features and advantages are substantially accomplished by satisfying the following conditions and requirements:

1. The latch is designed that when a very small signal or no signal at all is received on the bit line, the latch will set in a preferred state, namely, Node 1 at ground potential and Node 2 at VH potential.

The preferred setting of the latch may be accomplished in any one or combination of several ways, for example:

a. When the word line is accessed (going low), it couples charge out of the bit line, this disturbance is then amplified by the gain of the preamplifier formed by devices T1 and T2, this will unbalance nodes 1 and 2 prior to the latch being set.
  b. Controlling the timing skew between $\phi 2$ and $\overline{\phi 2}$.
  c. The geometry of the devices (T1, T2, T3, T4 and T5) can be designed to favor the latch setting in one direction.
  d. The relationship between the thresholds of devices T4 and T5 can be used to advantage if $|V_{TN}| < |V_{TP}|$, since device T5 will turn on prior to T4, thus unbalancing Node 1 toward the preferred state.

2. The small signal gain of the amplifier formed by T1 and T2 may be readily controlled by adjusting the effective channel lengths of T1 and T2 (since the voltage gain is directly proportional to the channel length).

Figure 5:
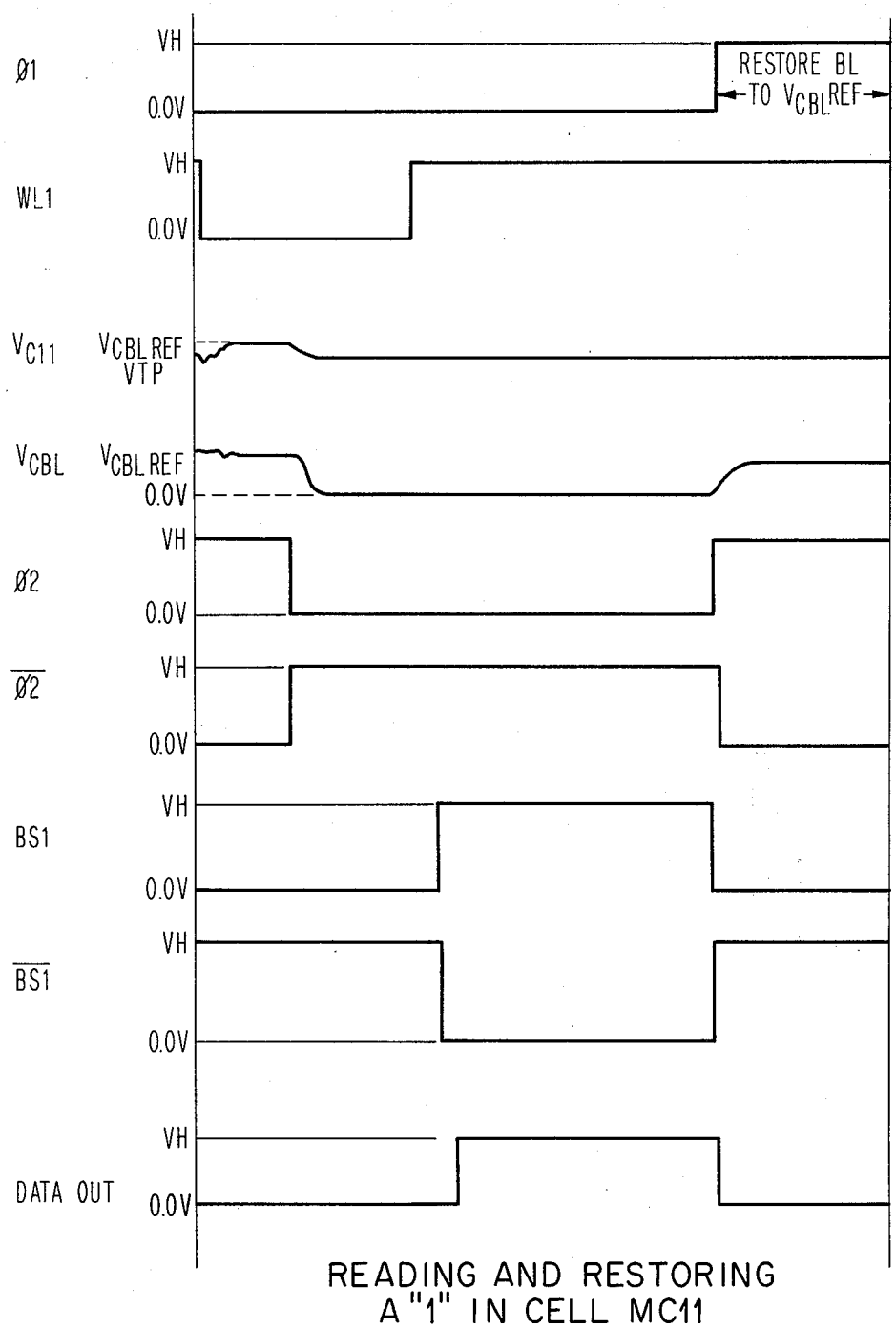
FIG. 5, when viewed in conjunction with FIGS. 1 and 2 placed together as shown in FIG. 3, depicts idealized representative waveforms for reading and restoring a binary "one" in memory cell MC11 of the monolithic memory in accordance with the invention disclosed and claimed in U.S. Pat. application Ser. No. 591,988.
Figure 6:
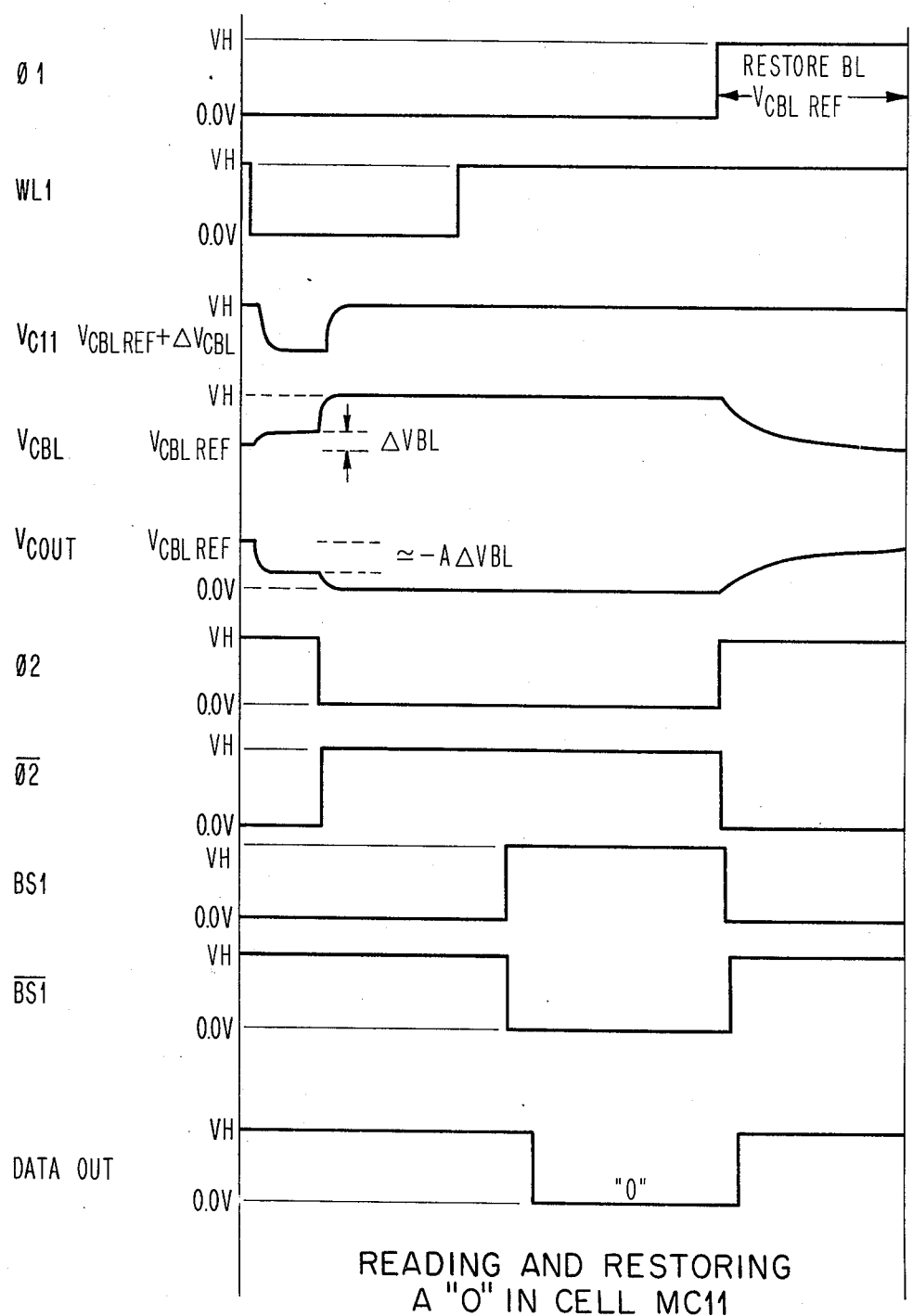
FIG. 6, when viewed in conjunction with FIGS. 1 and 2 placed together as shown in FIG. 3 depicts idealized representative waveforms for reading and restoring a binary "0" in memory cell MC11 of the monolithic memory in accordance with the invention disclosed and claimed in U.S. Pat. application Ser. No. 591,988.

The operation of the invention disclosed and claimed in United States Patent Application Serial No. 591,988 will now be described making reference to the drawing and in particular FIGS. 1, 5 and 6 thereof.

READING AND RESTORING A BINARY "ONE" FROM MEMORY CELL MC11. REFERENCE IS MADE TO THE IDEALIZED REPRESENTATIVE WAVEFORMS DEPICTED IN FIG. 5.

Assume the following initial conditions:
a. Word Line WL1 is at the potential VH, where VH is in the order of +5 volts.
b. $\phi 2$ is at the potential VH.
c. $\overline{\phi 2}$ is at ground potential.
d. $\phi 1$ is at VH potential.
e. $V_{C11} \simeq V_{TP}$ (where $V_{TP}$ is the threshold voltage of P-channel device of memory cell MC11).
1. $\phi 1$ is at VH potential, causes T3 to be turned on, hence devices T1 and T2 are biased on. The quiescent voltage (Nodes 1 and 2) is designed to be a value slightly less in magnitude than vH/2, but greater in magnitude than $V_{TP}$. Both $V_{CBL}$ and $V_{Cout}$ are restored to this quiescent voltage, which also places devices T1 and T2 in their high gain region.

2. $\phi 1$ goes to ground potential, T3 turns off, isolating Node 1. Via the gate-to-drain and gate-to-source capacitances of T3 charge is coupled off of capacitor $C_{BL}$ and $C_{out}$. However, since device T1 is conductive, charge is restored to Node 2 ($C_{out}$), while the charge taken from Node 1 ($C_{BL}$) is multiplied by the gain of the preamplifiers thereby causing the latch to become unbalanced in preferred direction.

3. Word Line WL1 goes to ground, turning T11 of memory cell MC11 on. Since $C_{11} \ll C_{BL}$ very little charge is subtracted from the bit line. While little charge is subtracted from the bit line, it does enhance the setting of the latch (BPSL1) to the preferred state.

4. While $V_{C_{BL}} < V_{C_{out}}$, $\phi 2$ goes to ground potential and $\overline{\phi 2}$ goes to the potential VH. Since $|V_{TN}| < |V_{TP}|$, T5 turns on before T4, thus further enhancing this unbalance and further causing the latch formed by T1, T2, T4 and T5 to be set in the proper direction or state. That is, Node 1 at ground potential and Node 2 at potential VH, which in turn restores the memory cell storage node to $V_{TP}$. An electrical manifestation of a binary "1" namely a potential of VH is provided at the output (Node 2) of Bidirectional Preamplifying Sense Latch BPSL1.

5. Word Line WL1 is brought to potential VH, locking the information (binary 1) on the storage node of memory cell MC11.

6. $\phi 1$ is brought to VH potential, $\phi 2$ to potential VH, and $\overline{\phi 2}$ to ground potential thus allowing Nodes 1 and 2 to be restored to their quiescent state. (Namely, the initial conditions as recited supra).

READING AND RESTORING A BINARY "ZERO" FROM MEMORY CELL MC11. Reference is made to the Idealized Representative Waveforms depicted in FIG. 6.

Assume the following initial conditions:
a. Word line WL1 is at the potential VH, where VH is in the order of +5 volts.
b. $\phi 2$ is at the potential VH.
c. $\overline{\phi 2}$ is at ground potential.
d. $\phi 1$ is at VH potential.
e. $V_{C_{11}} = $ VH (Power supply voltage).

1. $\phi 1$ at VH potential, causes T3 to be turned on, hence devices T1 and T2 are biased on. The quiescent voltage (Nodes 1 and 2) is designed to be a value slightly less in magnitude than VH/2, but greater in magnitude than $V_{TP}$. Both $V_{C_{BL}}$ and $V_{C_{out}}$ are restored to this quiescent voltage which also places devices T1 and T2 in their high gain region.

2. $\phi 1$ goes to ground potential, T3 turns off, and unbalances in the design causes $V_{C_{BL}} \lesssim V_{C_{out}}$.

3. Word line WL1 goes to ground, turning T11 of memory cell MC11 on. Since $V_{C_{11}} > V_{C_{BL}}$ sufficient charge is transferred to the bit line to cause it to go positive enough to override the previous unbalance, this $\Delta V_{BL}$ is also amplified by the amplifier T1 and T2 creating a very large differential in potential at Nodes 1 and 2. (This differential in potential is in the order of 2 volts when VH has a magnitude in the order of 4.5 volts).

4. $\phi 2$ goes to ground potential, while $\overline{\phi 2}$ goes to potential VH, since $V_{C_{out}} > V_{C_{BL}}$ by in the order of 2 volts the Bidirectional Amplifying Sense Latch formed by T1, T2, T4 and T5 is set in the proper direction or state. That is Node 1 at potential VH, and Node 2 at ground potential. An electrical manifestation of a binary "0", namely ground potential is provided at the output (Node 2) of Bidirectional Preamplifying Sense Latch BPSL1.

5. Word Line WL1 is brought to potential VH, locking the information (binary 0) on the storage node of memory cell MC11.

6. $\phi 1$ is brought to VH potential, $\phi 2$ to potential VH, and $\overline{\phi 2}$ to ground potential, thus allowing Nodes 1 and 2 to be restored to their quiescent state. (Namely, the initial conditions as recited supra).

Referring to FIGS. 1 and 2 placed together as shown in FIG. 3, and with reference to the foregoing description of the operation of the invention disclosed and claimed in U.S. Pat. Application Ser. No. 591,988, it will be apparent that a particular bit position associated with word line WL1, selected binary positions associated with word line WL1, or the bit positions constituting the complete binary word stored in the memory cells (MC11, MC21 - - - MCm1) and coupled to Word Line WL1 may be read from the memory by activating Word Line WL1 and the appropriate transmit gates (TG1, TG2 - - - - TGm). Correspondingly, it will be appreciated that any particular bit position associated with a particular word line, or selected binary bit positions associated with a particular word line, or a complete binary word associated with a particular word line may be read from the memory by activating the particular Word Line for a read operation and conditioning the appropriate transmit gates.

Each of the transmit gates TG1 through TGm are identical and of a type generally known to the art. Thus, for convenience and brevity of explanation only transmit gate TG1 and its operation will be explained. Referring to FIG. 1, assume that latch BPSL1 has stored therein a binary 0. From the preceding explanation, it will be recalled that Node 2 is at ground potential. It will be apparent that when transmit gage TG1 is conditioned by $\overline{BS1}$ going to ground potential, and BS1 going to potential VH, the input/output terminal IOT of gate TG1 will go to ground potential. Namely, with the transmit gate conditioned by the appropriate potentials on the gates of devices T6 and T7 the potential at IOT is the same as the potential at Node 2 of BPSL1.

WRITE OPERATION

BINARY ONE

From the preceding explanation and description, it will be apparent that a binary one may be written into memory cell MC11 by (1) impressing a potential of VH on Input/Output terminal IOT of transmit gate TG1. (2) conditioning the transmit gate TG1, (3) setting BPSL1 and (4) activating Word Line WL1. This causes Node 2 of BPSL1 to assume the potential VH, and Node 1 of BPSL1 to go to ground potential. With Node 1 at ground potential and Word Line WL1 conditioned a binary 1 is written into MC11.

BINARY ZERO

From the preceding explanation and description, it will be apparent that a binary zero may be written into memory cell MC11 by (1) impressing a potential of ground on Input/Output terminal IOT of transmit gate TG1 (2) conditioning the transmit gate TG1, (3) setting BPSL1 and (4) activating Word Line WL1. This causes Node 2 of BPSL1 to assume ground potential and Node 1 of BPSL1 to go the potential VH. With Node 1 at potential VH and Word Line WL1 conditioned a binary 0 is written into MC11.

Referring to FIG. 7 the preferred embodiment of the Read/Write buffer circuit in accordance with the invention will be described. The Read/Write or Send-/Receive circuit essentially comprises interconnected enhancement mode field effect transistors, namely T10, T20, T30, T40, T50, T60, T70 and T80 and resistor R. T10, T20, T50 and T60 are respectively P-channel enhancement mode field effect transistors. T30, T40, T70 and T80 are respectively n-channel enhancement mode field effect transistors. Each of the field effect transistors, as depicted in the drawing of FIG. 7, have first and second terminals and a gate electrode. Transistors T10 and T20 each have their first terminal connected to a substantially constant potential source VH, where VH may have a magnitude in the order of +4.5 to +5.0 volts. Transistor T50 has its first terminal connected to the second terminal of T10 and its second terminal connected to the input/output on chip terminal IOC1 of the Read/Write buffer circuit. Transistor T60 has its first terminal connected to the second terminal of T20 and its second terminal connected to the input/output off chip terminal IOC2 of the Read/Write buffer circuit. Transistors T30 and T40 each have their first terminal connected to a source of ground potential. Transistor T70 has its first terminal connected to the second terminal of T30 and its second terminal connected to the input/output on chip terminal IOC1 of the Read/Write buffer circuit. Transistor T80 has its first terminal connected to the second terminal of T40 and its first terminal connected to the input/output off chip terminal IOC2 of the Read/Write buffer circuit. Resistor R is connected between IOC1 and IOC2. The gate electrodes of T50 and T70 are respectively connected to IOC2. The gate electrodes of T60 and T80 are respectively connected to IOC1. The gate electrode of T10 is connected to a source of control potential (not shown) designated as $\overline{\text{WRITE}}$ in FIG. 7. The gate electrode of T30 is connected to a source of control potential (not shown) designated as WRITE in FIG. 7. The gate electrode of T20 is connected to a source of control potential (not shown) designated as $\overline{\text{READ}}$ in FIG. 7. The gate electrode of T40 is connected to a source of control potential (not shown) designated as READ in FIG. 7.

As will be more fully apparent from the detailed description of the operation of the Read/Write buffer circuit, the control signals impressed on the gates of T10, T20, T30 and T40 for a Write operation and Read operation are respectively as set forth in the tabular form in Table No. 1.

From the foregoing description and FIG. 7, it is apparent that the Read/Write buffer circuit is symmetrical. Hence as viewed in FIG. 7 and as will be more fully apparent from the detailed explanation hereinafter, the designations Read, $\overline{\text{Read}}$, Write, $\overline{\text{Write}}$, Input/output On chip and Input/output Off chip are employed solely for convenience of explanation. The circuit of FIG. 7 is bidirectional. The input/output terminals IOC1 and IOC2 are of equal dignity and perform like functions. It may be termed a send/receive for complimentary FET applications utilizing a transadmittance amplifier and capable of functioning as a latch. It is a bidirectional current sense circuit using a novel complementary FET structure which provides low impedance and requires low voltages for switching. These features permit the circuit to send and receive electrical manifestations at increased speed.

The Read/Write buffer circuit has particular utility when employed in pairs. A preferred embodiment of the invention employing a pair of Read/Write buffer circuits to provide bidirectional communication between a first memory chip MC1 and a second memory chip MC2 is depicted in FIG. 8. Memory chip MC1 (labelled enclosed broken line FIG. 8) is preferably a memory chip of the type disclosed and claimed in United States Patent Application Serial No. 591,988 where the Read/Write buffer circuit of FIG. 7 is integrally fabricated thereon with its input/output on chip terminal IOC1 connected to the line labelled "Bit-Dot". The line "Bit-Dot" of MC1 corresponding to the "Output Bus" of the memory of U.S. Pat. application Ser. No. 591,988 as depicted in FIGS. 1 and 2. Memory chip MC2 (labelled enclosed broken line FIG. 8) is preferably a memory chip of the type disclosed and claimed in U.S. Pat. Application Ser. No. 591,988 where the Read/Write buffer circuit of FIG. 7 is integrally fabricated thereon with its input/output on chip terminal IOC1 connected to the line labelled "Bit-Dot". The line "Bit-Dot" of MC2 corresponding to the "Output Bus" of the memory of U.S. Pat. Application Ser. No. 591,988 as depicted in FIGS. 1 and 2. Input/output Off chip terminal IOC2 of the Read/Write buffer circuit of chip MC1 is connected to Input/output off chip IOC2 of the Read/Write buffer circuit of chip MC2.

A capacitor $C_{DOT}$ is shown in dashed lines connected between terminal IOC1 and ground. The dashed lines indicate that no particular structure is added to the monolithic memory chip MC1 to provide the capacitor $C_{DOT}$. The capacitor $C_{DOT}$ represents the distributed stray capacitance seen by the Read/Write Buffer circuit of MC1 at its on chip terminal IOC1. A capacitor $C_{LINE}$ is shown in dashed lines connected between terminals IOC2 of MC1 and IOC2 of MC2 and ground. The dashed lines indicate that no particular structure is added to provide the capacitor $C_{LINE}$. The capacitor $C_{LINE}$ represents the distributed stray capacitance seen by the Read/Write buffer circuit of MC1 at its off chip

TABLE NO. 1

| Operation | $\overline{\text{Write}}$ Signal Gate of T10 | Write Operation Gate of T30 | $\overline{\text{Read}}$ Signal Gate of T20 | Read Signal Gate of T40 |
|---|---|---|---|---|
| Write Operation | 0 | VH | VH | 0 |
| Read Operation | VH | 0 | 0 | VH | terminal IOC2 and also seen by the Read/Write buffer circuit of MC2 at its off chip terminal IOC2. Namely the wire, lead, conductive path of a printed circuit board, conductive path of a multi-layer ceramic substrate or the like, namely the conductive means used to connect terminal IOC2 of MC1 to IOC2 of MC2, inherently provides this stray capacitance. A capacitor $C_{LOAD}$ is shown in dashed lines connected between terminal IOC1 of MC2 and ground. The dashed lines indicate that no particular structure is added to the monolithic memory chip MC1 to provide the capacitor $C_{LOAD}$. The capacitor $C_{LOAD}$ represents the distributed stray capacitance seen by the Read/Write Buffer Circuit of MC2 at its on chip terminal IOC1.

In a typical application such as the preferred embodiment, $C_{DOT}$ has a capacitance in the order of 3 to 6 pico farads, $C_{LINE}$ has a capacitance in the order of 30 pico farads, and $C_{LOAD}$ has a capacitance in the order of 3 to 6 pico farads.

Referring to FIGS. 7, 8 and 9 in particular, a Read Operation is as follows:
  a. A Read Signal of VH is impressed on the gates of transistors T40 of the Read/Write Buffer Circuits of MC1 and MC2, respectively.
  b. A $\overline{\text{Read}}$ Signal of ground potential is impressed on the gates of transistors T20 of the Read/Write Buffer Circuit of MC1 and MC2, respectively.
  c. a $\overline{\text{Write}}$ Signal of VH is impressed on the gates of transistors T10 of the Read/Write Buffer circuit of MC1 and MC2, respectively.
  d. A Write Signal of ground potential is impressed on the gates of T30 of the Read/Write Buffer Circuits of MC1 and MC2, respectively.
    1. T10 and T30 of MC1 and MC2 are off; T20 and T40 of MC1 and MC2 are on. (See FIG. 9)
    2. The active portion of the Read/Write Buffer Circuit of MC1 and the Read/Write Buffer circuit of MC2 is shown in FIG. 9.
  a. The output (IOC2 of MC1) is biased at VH/2 and the active portions of the Read/Write Buffer Circuits form a pair of transadmittance amplifiers. A current change at the input (IOC1 of MC1) causes a voltage change on the line (connection of IOC2 of MC1 to IOC2 of MC2). However, because $C_{LINE}$ is relatively large, typically 30 pico farads the current change is sensed by the receiver long before the voltage changes on the line.
  b. Since both ends the line (connection of IOC2 of MC1 to IOC2 of MC2) are active the line is essentially terminated by a lower impedance than is achievable by driver-receiver pairs known to the art. This feature in addition to the fact that the dv/dt on the line is much lower reduces the noise coupling significantly.

Referring to FIGS. 7, 8 and 9, in particular a Write Operation is as follows:
  a. A Write Signal of VH is impressed on the gates of transistors T30 of the Read/Write Buffer Circuits of MC1 and MC2.
  b. A $\overline{\text{Write}}$ Signal of ground potential is impressed on the gates of transistors T10 of the Read/Write Buffer circuits of MC1 and MC2.
  c. a $\overline{\text{Read}}$ Signal of VH is impressed on the gates T20 of the Read/Write Buffer circuits of MC1 and MC2.
  d. A Read Signal on ground potential is impressed on the gates of transistors T40 of the Read/Write Buffer circuit of MC1 and MC2, respectively.
    1. T20 and T40 of MC1 and MC2 are off; T10 and T30 of MC1 and MC2 are on.
    2. The Write operation is identical in operation to a Read operation except for the direction of communication. Namely, the left hand portions of the Read/Write Buffer circuits of MC1 and MC2 are active for a Write operation, whereas the right hand portions of the Read/Write Buffer circuits of MC1 and MC2, as depicted in FIG. 9 are active for a Read operation.

It is to be noted that I/O circuitry for communicating between monolithic chips is conserved by virtue of the fact that usually a byte or more of data is to be transferred in a single cycle. Since the Read/Write Buffer Circuitry in accordance with the invention requires only one control and communicates in both directions, I/O requirements are reduced in the order of 50%.

In summary, the Read/Write Buffer circuit, or send-/receive circuit, per se, is essentially a bidirectional current sense circuit, as depicted in FIG. 7. Transistor pairs T10, T30 and T20, T40 control whether or not the circuit is sending or receiving depending on which pair of transistors is activated. Assume for the moment that T20 and T40 are active and T10 and T30 are inactive. The resultant circuit would resemble the left-half of FIG. 9. Where T20 and T40 form a low resistance path to the sources of T60 and T80 respectively. Transistors T60 and T80 form the basic inverting amplifier stage, and resistor R (which could be a transmit gate biased in active region) functions as the necessary feedback to form a transadmittance amplifier. The feedback resistor R also serves to bias the output of the amplifier to approximately VH/2, thereby charging the interface wiring capacitor to the same potential. On the receiving chip is another circuit of the type shown in FIG. 7. It also has its control lines biased such that it forms the transadmittance amplifier shown on the right half of FIG. 9, since it is also biased in the high gain region, and since its input is now sensitive to current changes, one can now visualize that the interface line need not have its voltage change much to cause the output of the receiver to have a large change. This is because there can be a large change in both the direction and magnitude of current flow. Since the delay of the interface line is directly proportional to the required change in voltage and this configuration minimizes the $\Delta V$ required, its response time is greatly improved. Once the information is present at the receiver output, one can, if one desires, latch the data on the receiver for an indefinite period, by enabling the T10 and T30 of FIG. 7 as well as T20 and T40 on the receiver and simultaneously disabling T20 and T40 on the transmitting chip.

By reversing the sequence by which the various pairs of transistors are activated the rolls of receiver, transmitter and buffer are interchanged.

Applicant's invention is not to be construed as limited to the preferred embodiments. From the above description, it will be apparent to persons skilled in the art that the send/receive circuit in accordance with the invention has wide utility and application. For example, it may be employed to communicate between logic chips, and between chips employing various technology such as CMOS, TTL and DTL. Numerous modifications may be made, as will be apparent to persons skilled in the art without departing from the spirit or scope of the invention.

While the invention has been described and shown particularly with reference to one of its preferred embodiments, it will be understood by those skilled in the art to which the work is directed that various changes in form and in detail may be made without departing from either the spirit or scope of the invention.

What is claimed is:

1. A Read/Write buffer circuit contained on a monolithic random access memory chip and connected to the random access memory, said Read/Write buffer circuit comprising:
   a first input/output terminal;
   a second input/output terminal;
   first, second, third, fourth, fifth, sixth, seventh and eighth field effect transistors, each of said field effect transistors having a first terminal, a second terminal and a gate electrode;
   said first terminal of said first field effect transistor and said first terminal of said second field effect transistor being connected in common to a first substantially constant potential source;
   said first terminal of third transistor and said first terminal of said fourth transistor being connected in common to a second substantially constant potential source, said second potential source differing in magnitude from the magnitude of said first potential by a predetermined potential difference;
   said fifth field effect transistor having its first terminal connected to said second terminal of said first field effect transistor, its second terminal connected to said first input/output terminal and, said gate electrode of said fifth field effect transistor being connected to said second input/output terminal;
   said sixth field effect transistor having its first terminal connected to said second terminal of said second field effect transistor, its second terminal connected to said second input/output terminal and, said gate electrode of said sixth field effect transistor being connected to said first input/output terminal;
   said seventh field effect transistor having its first terminal connected to said second terminal of said third field effect transistor, its second terminal connected to said first input/output terminal, said gate electrode of said seventh field effect transistor being connected to said second input/output terminal;
   said eighth field effect transistor having its first terminal connected to said second terminal of said fourth field effect transistor, its second terminal connected to said second input/output terminal, said gate electrode of said seventh field effect transistor being connected to said first input/output terminal;
   resistor means connecting said first input/output terminal to said second input/output terminal, whereby when a $\overline{\text{Read}}$ signal is impressed on the gate electrode of said fourth field effect transistor and a Read signal impressed on the gate electrode of said second field effect transistor said sixth and eighth field effect transistors function as a basic inverting amplifier stage and said resistor means functions as feedback means to form a transadmittance amplifier and when a Write signal is impressed on the gate electrode of said third field effect transistor and a $\overline{\text{Write}}$ signal is impressed on the gate electrode of said first field effect transistor said fifth and seventh field effect transistors function as a basic inverting amplifier stage and said resistor means functions as feedback means to form a transadmittance amplifier.

2. A Read/Write buffer circuit as recited in claim 1 wherein said first, second, fifth and sixth field effect transistors are respectively P-channel enhancement mode devices, and said third, fourth, seventh and eighth field effect transistors are respectively N-channel enhancement mode devices.

3. A Read/Write buffer circuit as recited in claim 2 wherein said first input/output terminal is an "on chip terminal" for sending binary data to, and receiving binary data from memory circuitry contained on said memory chip on which said Read/Write buffer circuit is contained, and where said second input/output terminal is an "off chip terminal" for sending binary data to, and receiving binary data from a second monolithic memory circuit chip.

4. A Read/Write buffer circuit as recited in claim 2 wherein said first input/output terminal is an "on chip terminal" for sending binary data to, and receiving binary data from memory circuitry contained on said memory chip on which said Read/Write buffer circuit is contained, and where said second input/output terminal is an "off chip terminal" for sending binary data to, and receiving binary data from a second monolithic logic circuit chip.

5. Solid state electronic circuitry comprising:
   a first monolithic memory chip including a Read/Write buffer circuit as recited in claim 1, a second monolithic memory chip including a Read/Write buffer circuit as recited in claim 1, said first input/output terminal of said Read/Write buffer circuit of said first chip being connected to the memory circuit of said first chip, said first input/output terminal of said Read/Write buffer circuit of said second chip being connected to the memory circuit of said second chip, and means connecting the second input/output terminal of said Read/Write buffer circuit contained on said first chip to said second input/output terminal of said Read/Write buffer circuit contained on said second chip.

6. Solid state electronic circuitry as recited in claim 5 where said second chip is a monolithic logical circuit chip.

7. In a monolithic memory having a plurality of groups of memory cells, each memory cell comprising at least one FET device and being adapted to store a binary "1" or a binary "0", a Read/Write buffer circuit coupled to each of said groups of memory cells said Read/Write buffer circuit comprising:
   first and second circuit portions;
   each circuit portion consisting essentially of the serial interconnection of a like number of FET devices;
   means interconnecting said first and second circuit portions;
   said interconnection means including resistor means directly connected between said first and second circuit portions; and
   control means for controlling said Read/Write buffer circuit and said monolithic memory, whereby binary information may be selectively read from or written into said monolithic memory.

8. In a monolithic memory as recited in claim 7 wherein each storage cell consists essentially of a single FET device having an enhancement capacitor.

9. In a monolithic memory as recited in claim 7 wherein said Read/Write buffer circuit functions as a send/receive component and said monolithic memory and said buffer circuit are contained on a first monolithic chip.

10. In electronic apparatus having a first monolithic chip as defined in claim 9, a second monolithic chip having at least one Read/Write buffer circuit contained therein, said buffer circuit on said second chip communicating with said buffer circuit on said first chip.

11. In electronic apparatus as recited in claim 10 wherein said second chip contains logic circuitry selectively interconnected to said buffer circuit on said second chip.

* * * * *